United States Patent
Liu

(10) Patent No.: US 11,612,059 B2
(45) Date of Patent: Mar. 21, 2023

(54) DISPLAY PANEL AND TERMINAL DEVICE

(71) Applicant: BEIJING XIAOMI MOBILE SOFTWARE CO., LTD., Beijing (CN)

(72) Inventor: Anyu Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 23 days.

(21) Appl. No.: 16/694,481

(22) Filed: Nov. 25, 2019

(65) Prior Publication Data

US 2021/0029829 A1     Jan. 28, 2021

(30) Foreign Application Priority Data

Jul. 26, 2019   (CN) .......................... 201910684890.5

(51) Int. Cl.
*H05K 1/18*      (2006.01)
*G06F 3/147*   (2006.01)
*H05K 5/00*    (2006.01)

(52) U.S. Cl.
CPC ............. *H05K 1/189* (2013.01); *G06F 3/147* (2013.01); *H05K 5/0017* (2013.01); *H05K 2201/10128* (2013.01)

(58) Field of Classification Search
CPC ................. H05K 1/189; H05K 5/0017; H05K 2201/10128; H05K 1/118; H05K 2201/041; H05K 2201/049; G06F 3/147; G06F 1/1652; H04M 1/0268; H01L 51/0097; H01L 51/5253–5259; H01L 2251/5338; G02F 1/133305; G02F 1/133331
See application file for complete search history.

(56) References Cited

U.S. PATENT DOCUMENTS

| | | | |
|---|---|---|---|
| 2013/0002133 A1* | 1/2013 | Jin | H01L 27/3267 313/511 |
| 2016/0109852 A1* | 4/2016 | Kuwabara | G04G 17/08 368/223 |
| 2016/0212839 A1* | 7/2016 | Choi | H05K 1/147 |
| 2017/0171939 A1 | 6/2017 | Yang et al. | |
| 2017/0199544 A1* | 7/2017 | Choi | G06F 1/1652 |
| 2018/0083229 A1 | 3/2018 | Tsuruoka | |

(Continued)

FOREIGN PATENT DOCUMENTS

| | | |
|---|---|---|
| CN | 106601780 A | 4/2017 |
| EP | 3 352 436 A1 | 7/2018 |

OTHER PUBLICATIONS

Extended European Search Report dated Jul. 13, 2020 in corresponding European Patent Application No. 19217892.9, 6 pages.

*Primary Examiner* — Roshn K Varghese
(74) *Attorney, Agent, or Firm* — Oblon, McClelland, Maier & Neustadt, L.L.P.

(57) ABSTRACT

The present disclosure relates to a display panel and a terminal device. The display panel can include a display screen, a flexible circuit board, and a control chip. The display screen can further include a main display portion and a bent portion extending from an edge of the main display portion. The bent portion is bent towards a lower side of the main display portion. The flexible circuit board is connected to an end of the bent portion away from the main display portion and extends to below the main display portion. The control chip is mounted on the flexible circuit board.

12 Claims, 3 Drawing Sheets

(56) References Cited

U.S. PATENT DOCUMENTS

| | | |
|---|---|---|
| 2018/0143482 A1 | 5/2018 | Jin et al. |
| 2018/0210490 A1 | 7/2018 | Jin et al. |
| 2018/0211587 A1 | 7/2018 | Yu et al. |
| 2018/0329367 A1 | 11/2018 | Kuwabara et al. |
| 2019/0228698 A1 | 7/2019 | Hu et al. |
| 2019/0343010 A1* | 11/2019 | Ji .................. H04M 1/0268 |
| 2020/0009803 A1* | 1/2020 | Kang ................. B29C 65/48 |

* cited by examiner

DISPLAY PANEL AND TERMINAL DEVICE

CROSS-REFERENCE TO RELATED APPLICATIONS

This application claims priority to Chinese Patent Application Serial No. 201910684890.5, filed on Jul. 26, 2019, the disclosure of which is incorporated herein by reference in its entirety.

BACKGROUND

Display panels are important components of terminal devices. With the development of technologies, full screens have become one of the main development trends of terminal devices. Therefore, how to achieve a high screen-to-body ratio of display panels rises to a key issue. Additionally, encapsulating methods for display panels can affect the screen-to-body ratio, and therefore is also relevant.

SUMMARY

The present disclosure relates generally to a field of display screen encapsulating technologies, and more specifically to a display panel and a terminal device.

A display panel according to a first aspect of the present disclosure can include a display screen having a main display portion and a bent portion extending from an edge of the main display portion and bent towards a lower side of the main display portion. The display panel can further include a flexible circuit board connected to an end of the bent portion away from the main display portion and extending to below the main display portion, and a control chip mounted on the flexible circuit board.

A terminal device according to a second aspect of the present disclosure can include a housing and a display panel mounted on the housing. The display panel can include a display screen having a main display portion exposed outside the housing and a bent portion extending from an edge of the main display portion and having an end below the main display portion. The display panel can further include a flexible circuit board connected to the end of the bent portion and extending to below the main display portion, and a control chip mounted on the flexible circuit board and located inside the housing together with the flexible circuit board.

Another terminal device according to a second aspect of the present disclosure can include a housing having a side edge and a rear cover plate that cooperatively define a mounting chamber, and a display panel mounted on the housing. The display panel can include a display screen having a main display portion exposed outside the housing and a bent portion extending from the main display portion and having a curving portion and a straight portion, a flexible circuit board connected to the straight portion and extending to under the main display portion, and a control chip mounted on the flexible circuit board and located inside the mounting chamber together with the flexible circuit board.

BRIEF DESCRIPTION OF THE DRAWINGS

The accompanying drawings, which are incorporated in and constitute a part of this disclosure, illustrate embodiments consistent with the disclosure and, together with the description, serve to explain the principles of various exemplary embodiments of the disclosure.

DETAILED DESCRIPTION

Figure 1:
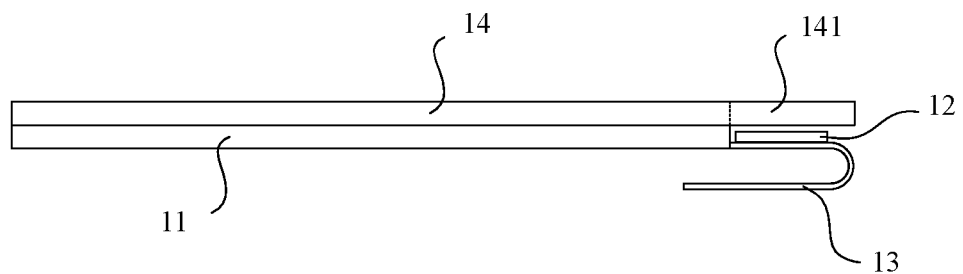
FIG. 1 is a schematic diagram of a display panel in the related art.

Embodiments of the present disclosure will be described in detail below, and examples of the embodiments will be illustrated in the accompanying drawings. In the following description with respect to the drawings, unless indicated otherwise, the same or similar elements are denoted by like reference numerals in different drawings. Implementations described in the following exemplary embodiments do not represent all embodiments consistent with the present application. On the contrary, they are merely examples of devices and methods consistent with some aspects of the present application as detailed in the appended claims.

Terms used herein in the description of the present disclosure are only for the purpose of describing specific exemplary embodiments, but should not be construed to limit the present disclosure. Unless otherwise defined, technical terms or scientific terms used herein shall be understood in the ordinary sense as understood by those of ordinary skill in the art to which the present application belongs. The words "a," "an" and the like used in the specification and the claims of the present application are not intended to limit the quantity but indicate the presence of at least one element or device referred to by the words. Unless otherwise indicated, the terms "comprising" or "containing" mean that the elements or articles before the terms "comprising" or "containing" includes the elements or articles listed after the terms "comprising" or "containing" and do not exclude other elements or articles. The terms "connected" or "coupled" and the like are not limited to physical or mechanical connection, but can include electrical connection, regardless of direct connection or indirect connection.

As used in the description of the present disclosure and the appended claims, the terms "a" and "the" in singular forms are intended to include plural forms, unless clearly indicated in the context otherwise. It should also be understood that, as used herein, the term "and/or" represents and contains any one and all possible combinations of COF encapsulation of one or more associated listed items.

Display panels can be encapsulated by way of COF (chip on flex or chip on film). Specifically, as illustrated in FIG. 1, a display panel includes a display screen 11 and a control chip 12 configured to a display function of the display screen 11. During encapsulation, the control chip is integrated on a flexible printed circuit (FPC) board 13, and the FPC board 13 has a first end connected to an edge of the display screen 11 and a second end bent to below the display screen 11. The display panel 1 further includes a cover plate 14 covering the display screen 11, and the cover plate 14 includes a shielding area 141 corresponding to the control chip 12 to shield the control chip 12. In such a way, after the display panel is installed into a terminal device, the terminal device has a wide black border (the shielding area 141) on its display surface, which affects the screen-to-body ratio of the display panel.

Some exemplary embodiments provides a display panel that can include a display screen having a main display portion and a bent portion extending from an edge of the main display portion that is bent towards a lower side of the main display portion. The display screen can also include a flexible circuit board connected to an end of the bent portion away from the main display portion and extending to below the main display portion, and a control chip mounted on the flexible circuit board.

Other exemplary embodiments provide a terminal device that can include a housing and a display panel mounted on the housing. The display panel can further include a display screen having a main display portion exposed outside the housing and a bent portion extending from an edge of the main display portion and having an end below the main display portion. A flexible circuit board can be connected to the end of the bent portion and extend to below the main display portion. Further, a control chip can be mounted on the flexible circuit board and located inside the housing together with the flexible circuit board.

Some exemplary embodiments can provide another terminal device including a housing having a side edge and a rear cover plate. The side edge and the rear cover plate cooperatively define a mounting chamber. A display panel can be mounted on the housing and include a display screen that has a main display portion exposed outside the housing and a bent portion extending from the main display portion and having a curving portion and a straight portion. Further, a flexible circuit board can be connected to the straight portion and extending to under the main display portion, and a control chip can be mounted on the flexible circuit board and located inside the mounting chamber together with the flexible circuit board.

Figure 2:
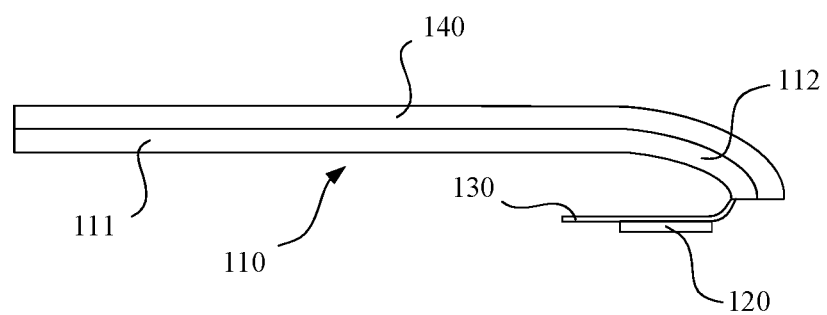
FIG. 2 is a schematic diagram of a display panel according to exemplary embodiments.
Figure 3:
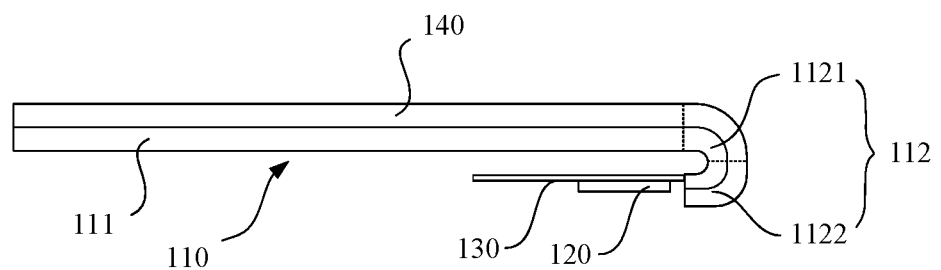
FIG. 3 is a schematic diagram of a display panel according to some other exemplary embodiments.
Figure 4:
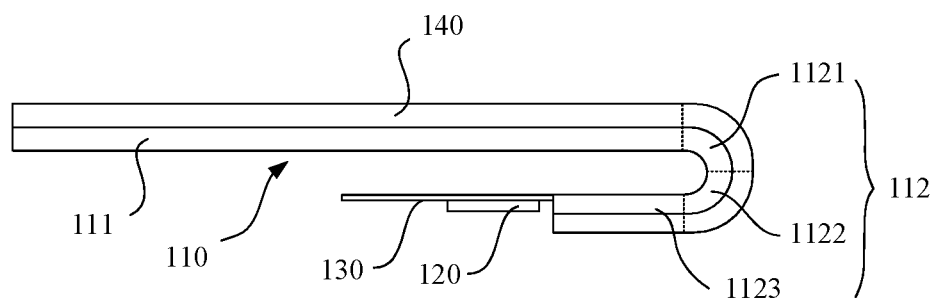
FIG. 4 is a schematic diagram of a display panel according to still some other exemplary embodiments.
Figure 5:
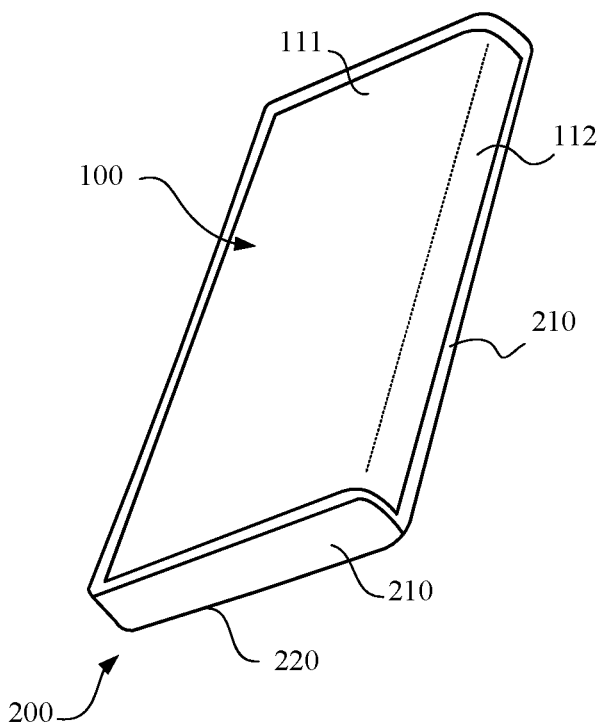
FIG. 5 is a schematic diagram of a terminal device according to some exemplary embodiments.
Figure 6:
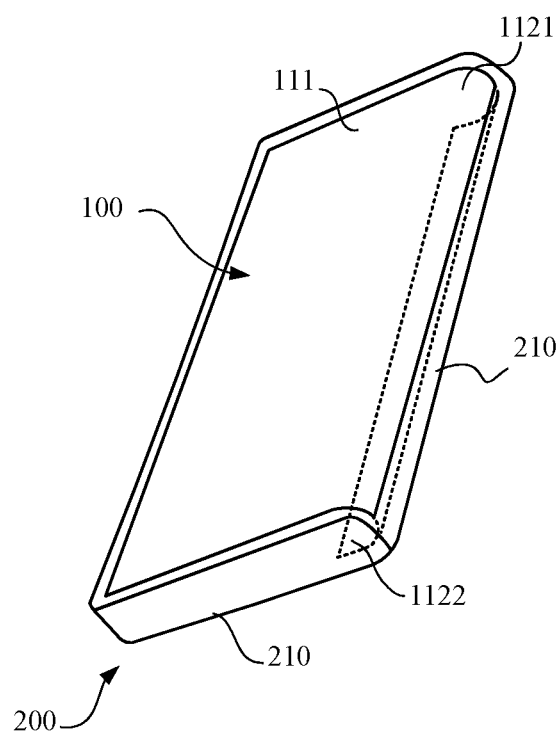
FIG. 6 is a schematic diagram of a terminal device according to some other exemplary embodiments.
Figure 7:
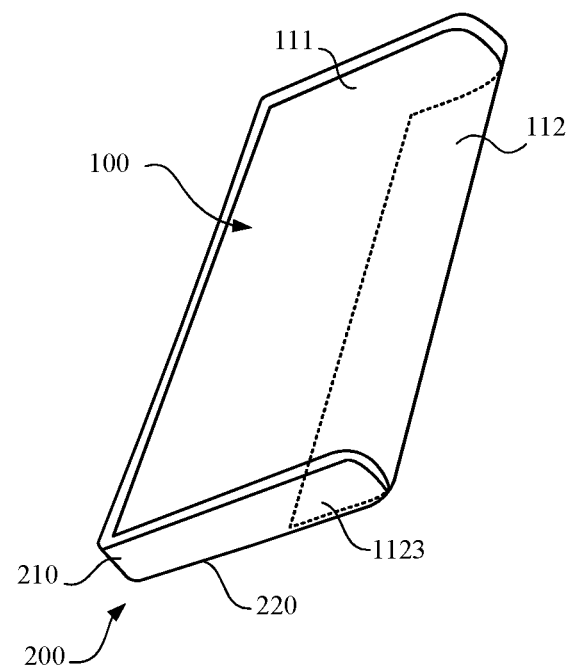
FIG. 7 is a schematic diagram of a terminal device according to still some other exemplary embodiments.

Directed at the above problem, embodiments of the present disclosure propose a display panel and a terminal device. FIGS. 2-4 are schematic diagrams of display panels according to different exemplary embodiments. FIGS. 5-7 are schematic diagrams of terminal devices according to different exemplary embodiments.

As illustrated in FIGS. 2-4, a display panel 100 includes a display screen 110. The display screen 110 includes a main display portion 111, and a bent portion 112 connected to an edge of the main display portion 111.

The main display portion 111 is a main area where the display panel 100 displays images. When the display panel 100 is installed in a terminal device, the main display portion 111 is located on a display surface of the terminal device. The main display portion 111 can be straight or have a certain degree of curvature.

The bent portion 112 is bent towards a lower side of the main display portion 111. It should be noted that the display screen 110 has a surface capable of displaying images normally, and in embodiments of the present disclosure, an up-and-down direction is determined with reference to the display surface of the main display portion 111. Specifically, one side of the main display portion 111 where contents on the display surface are visible is regarded as an upper side, while the other side of the main display portion 111 where contents on the display surface are invisible is regarded as a lower side.

Moreover, the display screen 110 has an integral structure, i.e., the display screen 110 is a one-piece member which is bent or curved at a portion. The main display portion 111 and the bent portion 112 are formed by a bending or curving process. In the embodiments of the present disclosure, the main display portion 111 and the bent portion 112 are merely used to represent different portions of the display screen 110 rather than two independently available components.

The control chip 120 of the display panel 100 is integrated on a flexible circuit board 130. Furthermore, the flexible circuit board 130 is connected to an end of the bent portion 112 away from the main display portion 111 and extends to below the main display portion 111. The control chip 120 extends along the flexible circuit board 130 and is also located below the main display portion 111.

In the embodiments of the present disclosure, the bent portion 112 of the display screen 110 has various implementations. Hereinafter, the connection between the bent portion 112 and the flexible circuit board 130 will be described.

As an alternative, as illustrated in FIG. 2, the bent portion 112 extends in a direction away from the main display portion 111, along a length direction or a width direction of the main display portion 111. In an example where the bent portion 112 is connected to an edge of the main display portion 111 along the length direction, the bent portion 112 extends in a direction away from the main display portion 111 along the width direction of the main display portion 111. At this time, the bent portion 112 has a quarter-arc shape.

In such a case, the flexible circuit board 130 is drawn from the end of the bent portion 112 away from the main display portion 111, and is bent such that the control chip 120 is located below the main display portion 111. In such a way, the degree of bending of the flexible circuit board 130 can be reduced, and the durability of the flexible circuit board 130 can be improved.

As an alternative, as illustrated in FIG. 3, the bent portion 112 includes a first portion 1121 extending from an edge of the main display portion 111, and a second portion 1122 extending from an edge of the first portion 1121 away from the main display portion 111. In the length direction or the width direction of the main display portion 111, the first portion 1121 extends in a direction away from the main display portion 111, and the second portion 1122 extends in a direction approaching the main display portion 111. For example, when the bent portion 112 extends from an edge of the main display portion 111 along the length direction, in the width direction of the main display portion 111, the first portion 1121 extends in the direction away from the main display portion 111, and the second portion 1122 extends in the direction approaching the main display portion 111. At this time, the bent portion 112 has a semi-arc shape or a C-shape.

In such a case, the flexible circuit board 130 is drawn from the end of the bent portion 112 away from the main display portion 111, and can directly extend to below the main display portion 111 without bending. In such a way, under a guiding action of the second portion 1122, the flexible circuit board 130 can extend to below the main display portion 111 without bending, thereby further improving the durability of the flexible circuit board 130 and avoiding bending and breaking.

In an alternative shown in FIGS. 2 and 3, when the bent portion 112 extends from an edge of the main display portion 111 along the width direction, the extension direction of the bent portion 112 refers to the length direction of the main display portion 111.

As an alternative, as illustrated in FIG. 4, based on the example shown in FIG. 3, besides the first portion 1121 and the second portion 1122, the bent portion 112 further includes a third portion 1123 extending from an edge of the second portion 1122 away from the first portion 1121 to below the main display portion 111.

In such a case, the guiding property of the bent portion 112 is enhanced such that the flexible circuit board 130 directly extends to below the main display portion 111 without bending.

Moreover, as illustrated in FIGS. 2-4, the display panel 100 can further include a cover plate 140 attached to the display screen 110. Specifically, the cover plate 140 is attached to the main display portion 111 and the bent portion 112, and the degree of bending of the cover plate 140 is consistent with that of the bent portion 112 to achieve close fitting.

In the display panel 100 according to the embodiments of the present disclosure, the connection between the display screen 110 and the flexible circuit board 130 is below the main display portion 111 by means of the bent portion 112 of the display screen 110. Therefore, in a plane where the main display portion 111 is located, a user cannot observe the connection between the flexible circuit board 130 and the display screen 110. Thus, for the cover plate 140 of the display panel 100, it is not necessary to shield the control chip 120 and the flexible circuit board 130 in the plane where the main display portion 111 is located, thereby reducing the width of the shielding area on the cover plate 140, and increasing the screen-to-body ratio of the display panel.

In an embodiment, the bent portion 112 extends from the edge of the main display portion 111 along the length direction. In such a way, the flexible circuit board 130 is drawn from a lateral portion of the display screen 110. Hence, when the display panel 100 is applied to a terminal device such as a mobile phone, the bent portion 112 is arranged on a long side of the terminal device. As a result, the problem that a lower end portion (a chin portion) of the display panel in the related art has a large black board can be solved, and perforated structures fitted with functional modules (e.g., a camera module, a loudspeaker module, an earphone module, etc.) can be retained on upper and lower end portions (forehead and chin portions) of the terminal device.

In a second aspect, exemplary embodiments of the present disclosure provide a terminal device. Optionally, the terminal device includes a mobile phone, a tablet computer, a wearable device (e.g., a bracelet, a watch, etc.), an on-vehicle device, a medical device, and the like, all of which have a display panel. In the drawings, a mobile phone is merely taken as an example for exemplary explanation.

As illustrated in FIGS. 5-7, the terminal device includes a housing 200 and the display panel 100 according to the first aspect of the present disclosure.

The housing includes a side edge 210 and a rear cover plate 220, and the side edge 210 and the rear cover plate 220 define a mounting cavity. The display panel 100 is installed on the housing 200, and the main display portion 111 of the display screen 110 of the display panel 100 is directly exposed outside the housing 200. The control chip 120 and the flexible circuit board 130 of the display panel 100 are mounted in the mounting cavity of the housing 200.

The terminal device according to the embodiments of the present disclosure can realize a full-screen display effect due to the advantage that the above display panel 100 has a large screen-to-body ratio. Moreover, the durability of the display panel 100 is high, which is conductive to prolonging the service life of the overall terminal device.

In an embodiment, as illustrated in FIG. 5, the bent portion 112 of the display screen 110 extends to the side edge 210 of the housing 200. At this time, the side edge of the terminal device can perform display.

Exemplarily, as illustrated in FIG. 5, in combination with FIG. 2, the end of the bent portion 112 away from the main display portion 111 is joined to the side edge 210 of the housing 200.

Exemplarily, as illustrated in FIG. 6, in combination with FIG. 3, the bent portion 112 includes the first portion 1121 and the second portion 1122 as illustrated in FIG. 3. The first portion 1121 extends from the edge of the main display portion 111, and the second portion 1122 extends from the edge of the first portion 1121 away from the main display portion 111. Moreover, the connection between the first portion 1121 and the second portion 1122 is joined to the side edge 210 of the housing 200.

In such a way, a portion of the first portion 1121 of the bent portion 112 adjacent to the main display portion 111 is exposed outside the housing 200, thereby enabling normal display. A portion of the second portion 1122 away from the first portion 1121 is disposed in the mounting cavity of the housing 200. Thus, the full-screen display effect of the display panel of the terminal device can be further optimized.

In an embodiment, as illustrated in FIG. 7, the bent portion 112 of the display screen 110 extends to the rear cover plate 220 of the housing 200. In such a case, in combination with FIG. 4, the bent portion 112 includes the first portion 1121, the second portion 1122, and the third portion 1123 arranged sequentially along the direction away from the main display portion 111. The first portion 1121 and the second portion 1122 forms one side edge of the terminal device, and the third portion 1123 extends to the rear cover plate 220. In such a way, the full-screen display effect of the display panel of the terminal device can be further optimized.

Additionally, the terminal device further can include an under-screen component disposed under the display screen and located in the mounting cavity, such as a camera module, a fingerprint recognition module, and the like. During assembly, the under-screen component is mounted in place in advance, and then the flexible circuit board 130 is bent to below the main display portion 111 to prevent the flexible circuit board 130 from affecting the installation of other components. Moreover, the flexible circuit board 130 is provided with a connector, so as to be coupled with a controller disposed in the mounting cavity of the terminal device.

Other embodiments of the present disclosure will be readily apparent to those skilled in the art after considering the specification and practicing the disclosure herein. The present application is intended to cover any variations, usages, or adaptations of the present disclosure, which are in accordance with the general principles of the present disclosure and include common knowledge or conventional technical means in the art that are not disclosed in the present disclosure. The specification and embodiments are merely exemplary, and the true scope is pointed out by the appended claims.

What is claimed is:

1. A display panel, comprising:
   a display screen including a main display portion and a bent portion extending from an edge of the main display portion and bent towards a lower side of the main display portion, wherein the main display portion and the bent portion form an integral structure and display images, and the bent portion comprises a portion located below the main display portion;
a straight flexible circuit board directly connected to a side of the portion of the bent portion and extending below the main display portion, the side facing the main display portion;
a control chip mounted on the straight flexible circuit board; and
a cover plate attached to the main display portion and the bent portion and configured to cover the entire bent portion, both ends of the cover plate being aligned with both ends of the display screen.

2. The display panel according to claim 1, wherein the bent portion extends from an edge of the main display portion along a length direction of the main display portion.

3. The display panel according to claim 1, wherein the bent portion extends in a direction away from either a length direction or a width direction of the main display portion.

4. The display panel according to claim 1, wherein the bent portion further comprises:
a first portion extending away from an edge of the main display portion in a first direction that is either in a length direction or a width direction of the main display portion;
a second portion extending from an edge of the first portion in a second direction away from the main display portion and being curved to extend back towards the main display portion in a third direction that is either in the length direction or the width direction of the main display portion; and
a third portion configured as the portion located below the main display portion, and extending from an edge of the second portion away from the first portion.

5. A terminal device, comprising:
a housing; and
a display panel mounted on the housing and comprising:
a display screen comprising a main display portion exposed outside the housing and a bent portion extending from an edge of the main display portion and having a portion located below the main display portion, wherein the main display portion and the bent portion form an integral structure and display images,
a straight flexible circuit board directly connected to a side of the portion of the bent portion and extending to below the main display portion, the side facing the main display portion,
a control chip mounted on the straight flexible circuit board and located inside the housing together with the straight flexible circuit board, and
a cover plate attached to the main display portion and the bent portion and configured to cover the entire bent portion, both ends of the cover plate being aligned with both ends of the display screen.

6. The terminal device according to claim 5, wherein the housing comprises a side edge, and the bent portion of the display screen extends to the side edge of the housing.

7. The terminal device according to claim 6, wherein the bent portion of the display screen further comprises a first portion extending from the edge of the main display portion and a second portion extending from an edge of the first portion away from the main display portion and connected to the portion located below the main display portion, and a connection between the first portion and the second portion is joined to the side edge of the housing.

8. The terminal device according to claim 5, wherein the bent portion of the display screen comprises a first portion, a second portion, and the portion arranged sequentially along a direction away from the main display portion, the housing comprises a rear cover plate, and the portion located below the main display portion extends to the rear cover plate.

9. The terminal device according to claim 5, wherein the control chip is mounted on a side of the straight flexible circuit board away from the display screen.

10. A terminal device, comprising:
a housing including a side edge and a rear cover plate, the side edge and the rear cover plate cooperatively defining a mounting chamber; and
a display panel mounted on the housing, comprising:
a display screen comprising a main display portion exposed outside the housing and a bent portion extending from the main display portion and having a curving portion and a straight portion located under the main display portion, wherein the main display portion and the bent portion form an integral structure and display images,
a straight flexible circuit board directly connected to a side of the straight portion and extending to under the main display portion, the side facing the main display portion,
a control chip mounted on the straight flexible circuit board and located inside the mounting chamber together with the straight flexible circuit board, and
a cover plate attached to the main display portion and the bent portion and configured to cover the entire bent portion, both ends of the cover plate being aligned with both ends of the display screen.

11. The terminal device according to claim 10, wherein the curving portion is exposed outside the housing and opposite the side edge, and the straight portion extends to the rear cover plate.

12. The terminal device according to claim 10, wherein the control chip is mounted on a side of the straight flexible circuit board away from the display screen.

* * * * *